United States Patent [19]
Liou et al.

[11] Patent Number: 5,847,460
[45] Date of Patent: Dec. 8, 1998

[54] SUBMICRON CONTACTS AND VIAS IN AN INTEGRATED CIRCUIT

[75] Inventors: Fu-Tai Liou, Plano; Mehdi Zamanian, Carrollton, both of Tex.

[73] Assignee: STMicroelectronics, Inc., Carrollton, Tex.

[21] Appl. No.: 574,659

[22] Filed: Dec. 19, 1995

[51] Int. Cl.$^6$ .......................... H01L 23/48; H01L 23/52; H01L 29/40; H01L 23/58
[52] U.S. Cl. .................... 257/751; 257/635; 257/649; 257/754; 257/774
[58] Field of Search .................... 257/751, 774, 257/649, 754, 644, 639, 635

[56] References Cited

U.S. PATENT DOCUMENTS

| | | | |
|---|---|---|---|
| 3,801,880 | 4/1974 | Harada et al. | 317/234 |
| 4,656,732 | 4/1987 | Teng et al. | 29/591 |
| 4,677,739 | 7/1987 | Doering et al. | 29/576 |
| 4,720,908 | 1/1988 | Wills | 437/192 |
| 4,837,183 | 6/1989 | Polito et al. | 437/198 |
| 4,960,732 | 10/1990 | Dixit et al. | 437/192 |
| 4,962,414 | 10/1990 | Liou et al. | 357/71 |
| 4,994,410 | 2/1991 | Sun et al. | 437/192 |
| 5,067,002 | 11/1991 | Zdebel et al. | 357/59 |
| 5,094,979 | 3/1992 | Kusano | 437/187 |
| 5,106,781 | 4/1992 | Penning De Vries | 437/192 |
| 5,117,273 | 5/1992 | Stark et al. | 357/54 |
| 5,194,929 | 3/1993 | Ohshima et al. | 257/326 |
| 5,270,254 | 12/1993 | Chen et al. | 437/190 |
| 5,321,211 | 6/1994 | Haslam et al. | 174/262 |
| 5,408,130 | 4/1995 | Woo et al. | 257/758 |
| 5,437,763 | 8/1995 | Huang | 437/194 |
| 5,512,785 | 4/1996 | Haver et al. | 257/758 |
| 5,604,367 | 2/1997 | Yang | 257/321 |

FOREIGN PATENT DOCUMENTS

| | | | |
|---|---|---|---|
| 0 388 563 | 9/1990 | European Pat. Off. | H01L 21/60 |
| 524818 | 1/1993 | European Pat. Off. | 257/774 |
| 57-50429 | 3/1982 | Japan . | |
| 62-133713 | 6/1987 | Japan | H01L 21/28 |
| 1-289142 | 11/1989 | Japan | 257/774 |
| 6-29406 | 2/1994 | Japan | 257/774 |
| 2-206729 | 1/1989 | United Kingdom | 257/774 |
| 93/09566 | 5/1993 | WIPO | 257/649 |

OTHER PUBLICATIONS

F.S. Chen, et al., "Planarized Aluminum Metallization for Sub–0.5 $\mu$m CMOS Technology", IEDM, 1990, pp. 51–54.
V.V. Lee, et al, "Selective CVD Tungsten Local Interconnect Technology", IEDM, 1988, pp. 450–453.
Ono, et al., "Development of a Planarized A1–S1 Contact Filling Technology", Jun. 12–13, 1990 VMIC Conference, pp. 76–82.

*Primary Examiner*—Teresa M. Arroyo
*Attorney, Agent, or Firm*—Theodore E. Galanthay; Kenneth C. Hill; Lisa K. Jorgenson

[57] ABSTRACT

A method is provided of forming a small geometry via or contact of a semiconductor integrated circuit, and an integrated circuit formed according to the same, is disclosed. According to a first disclosed embodiment, an opening is formed partially through an insulating layer overlying a conductive region. Sidewall spacers are formed along the sidewalls of the opening. The remaining insulating layer is etched to expose the underlying conductive region. The contact dimension of the opening is smaller than the opening which can be printed from modern photolithography techniques. According to an alternate embodiment, the opening in the insulating layer expose the underlying conductive region. A polysilicon layer is formed over the insulating layer and in the opening. The polysilicon is oxidized to form a thick oxide in the opening and is etched back to form oxidized polysilicon sidewall spacers which decrease the contact dimension of the opening. According to a further alternate embodiment, an etch stop layer is formed between the insulating layer and conductive region and an opening is formed in the insulating layer exposing the etch stop layer. A sidewall spacer film is formed over the insulating layer and the etch stop layer, both layers having a similar etch rate for a given etchant. The etch stop and spacer layers are etched in the opening to expose the underlying conductive layer thereby forming a contiguous sidewall spacer and etch stop layer on the sides of and under the insulating layer, thereby decreasing the contact dimension of the opening.

20 Claims, 6 Drawing Sheets

SUBMICRON CONTACTS AND VIAS IN AN INTEGRATED CIRCUIT

This application is related to the U.S. application filed on the same day herewith, on Dec. 19, 1995, U.S. Ser. No. 08/575,691 entitled METHOD OF FORMING SUBMICRON CONTACTS AND VIAS IN AN INTEGRATED CIRCUIT, which has been assigned to the assignee hereof and incorporated by reference herein.

FIELD OF THE INVENTION

The present invention relates generally to semiconductor integrated circuit processing, and more specifically to an improved method of forming submicron contacts and vias.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the current photolithographic equipment and materials available in the industry. The equipment and masks used in photolithography project an image of patterns onto a wafer surface. One of the important characteristics in VLSI fabrication is the resolution or the optical system's ability to distinguish closely spaced objects. The resolution of the system is one of the main limitations of achieving minimum device sizes required. In establishing the horizontal dimensions of the various devices and circuits, a pattern must be created which meets design requirements as well as to correctly align the circuit pattern on the surface of the wafer. As line widths shrink smaller and smaller in submicron photolithography, the process to print lines and contact holes in photoresist becomes increasingly more difficult.

In semiconductor processing, semiconductive and conductive regions or layers are formed and subsequently interconnected to create components and circuits. The lithographic process uses patterns to define these regions. One of the critical steps is the interconnection of two conducting layers on different levels that are separated by an insulating layer, especially when one of the conductive layers is the top metal layer. Presently, an underlying conductor layer is covered with an interlevel oxide layer and then the contact or via is formed therein to expose the surface of the underlying conductor layer at a selected region. A top conducting layer is then patterned and interconnected through the contact or via with the underlying conducting material. This underlying conducting material can comprise either a conductive layer of polysilicon or metal or even an active area on or in the silicon surface itself.

Conventional technology shrink such as forming contacts and vias has been done primarily through improvements in photolithography capability. The dependency on photolithography to achieve adequate projection of images of patterns onto the wafer surfaces is limited by the photolithography equipment's capability, especially as feature sizes continue to decrease. To go beyond technology at any given point in time and achieve the required technology shrink may well require new photolithography equipment. However, technology continues to push the limit on current equipment. Thus, it would be desirable to achieve device sizes below the current photolithography capability.

Accordingly, it is an object of the present invention to provide a method of forming submicron contacts and vias.

It is a further object of the present invention to provide such a method of forming contacts and vias having feature sizes below that which is capable of being produced with current photolithography technology and without sacrificing device performance.

It is yet another object of the present invention to provide such a method of forming contacts and vias having contact dimensions smaller than the contact dimensions which can be printed with modern photolithography equipment.

It is still further an object of the present invention to provide such a method which utilizes conventional process techniques.

Other objects and advantages of this invention will be apparent to those of ordinary skill in the art having reference to the following specification, together with its drawings.

SUMMARY OF THE INVENTION

The invention may be incorporated into a method of forming small geometry vias and contacts of a semiconductor device structure, and the semiconductor device structure formed thereby, by forming sidewall spacers along the sides of the via and contact openings. According to a first embodiment of the invention, an opening is made partially through an insulating layer overlying a conductive region. Sidewall spacers are formed along the sides of the opening. The top of the sidewall spacers are below the top of the insulating layer by a distance approximately equal to the thickness of the remaining insulating layer in the opening. The insulating layer is then anisotropically etched to expose the conductive region. An upper surface of the insulating layer may also be removed in the etch step by a substantially equivalent thickness causing the upper layer to be substantially planar with the top of the sidewall spacers. According to an alternate embodiment, the opening in the insulating layer exposes the underlying conductive region. A conformal polysilicon layer is formed over the insulating layer and in the opening. The polysilicon is oxidized to form a thick oxide in the opening. The oxidized polysilicon is anisotropically etched to form oxidized polysilicon sidewall spacers. According to a further alternate embodiment, an etch stop layer is formed between the insulating layer and the conductive region. The opening in the insulating layer exposes the etch stop layer. A sidewall spacer film is formed over the insulating layer and the etch stop layer in the opening. The etch stop layer and the sidewall spacer film have similar etch rates for a given etchant and are etched to expose the underlying conductive region. This etch step forms a contiguous sidewall spacer and etch stop layer along the sidewalls of the opening and under the insulating layer. According to yet another alternate embodiment, a second insulating layer is formed over the etch stop layer before the spacer film is formed. An opening is formed in the second insulating layer, then the spacer film is formed over the second insulating layer and the etch stop layer in the opening. The spacer film and etch stop layer are etched to form spacers and expose a portion of the first insulating layer in the opening. A second opening is formed in the first underlying insulating layer exposing the conductive layer. The second insulating layer, etch stop layer and sidewall spacers are preferably removed. The contact dimension of the opening through the underlying insulating layer is smaller then the contact dimension through the second overlying insulating layer. The present invention provides for via and contact geometries which are smaller than geometries achievable with modern photolithographic equipment and photoresists.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
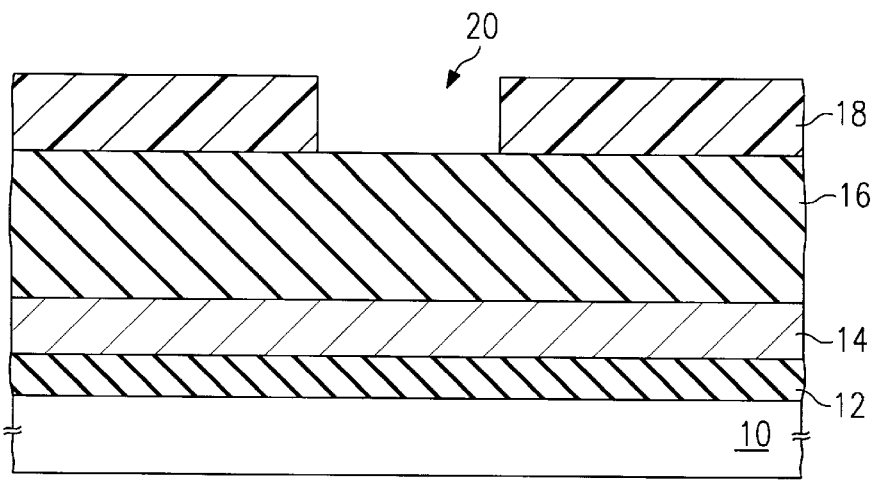
FIGS. 1–5 are cross-sectional views of the fabrication of a semiconductor integrated circuit according to a first embodiment of the present invention.

Referring to FIGS. 1 through 5, a portion of an integrated circuit formed according to a first embodiment of the present invention will now be described. FIG. 1 illustrates, in cross-section, a partially formed integrated circuit structure at a surface of a wafer. Typically an insulating layer 12 is formed to isolate devices or conductive layers. For example, insulating layer 12 may be a field oxide region at a substrate surface 10 or may be an interlevel dielectric layer separating conducting regions or layers at different levels as known in the art. Conductive layer 14 lies over insulating layer 12, and is the structure to which connection is to be made in this invention. Insulating layer 16 is disposed over the conductive layer 14. As noted hereinabove, while a contact to a conductive layer overlying an insulating layer will be illustrated, the invention is equivalently applicable to contacts to a diffusion in the substrate, polysilicon electrodes, metal lines, and other structures in conventional integrated circuits. Furthermore, it should be noted that the present invention is also compatible with planarized processes, where contacts of different depths must be simultaneously made from the same planar surface (e.g. contacts to diffusion and polysilicon both made from the same planarized surface of silicon dioxide). Those skilled in the art will understand how to form a field oxide region or an interlevel dielectric layer 12.

In the present invention, conductive layer 14 is shown as an interconnect line, which may a metal or doped polysilicon interconnect, formed by depositing a thin layer on the order of 2000 to 7000 angstroms. As noted above, however, conductive layer 14 may also be a polysilicon electrode or a diffusion in the substrate or other structure in conventional integrated circuits. For metal or polysilicon, any suitable deposition process may be used consistent with the layer being formed, such as chemical vapor deposition, sputtering or vacuum evaporation. The unwanted regions of the conductive layer 14 are masked using standard photolithography techniques and etched, leaving the conductive lines or interconnects shown. If polysilicon is the preferred material, it may of course be doped in situ during the deposition process or may be doped after deposition.

Insulating layer 16 may be any conventional insulator useful in modern integrated circuits, and preferably comprises a silicon dioxide, either as a single or as multiple layers. The thickness of layer 16 through which a subsequent contact or via opening will be made is on the order of 1.0 $\mu$m.

In FIG. 1, photoresist layer 18 is formed over insulating layer 16 and is illustrated after it has been exposed and developed to define the smallest mask pattern achievable for the contact to be made. The resolution capability of the photoresist as well as the equipment used to correctly align and expose the photoresist will determine the particular size or contact dimension of opening 20. There is a need in state-of-the-art technology to achieve smaller images and thus be able to print smaller lines to achieve reduced contact dimensions. Among other advantages, this will allow devices to be formed closer together thereby increasing packing density without reducing device integrity. However, with today's technology, these smaller openings may not be achievable with current photoresists and equipment. The technological needs continue to push the limits on photoresist equipment.

Figure 2:
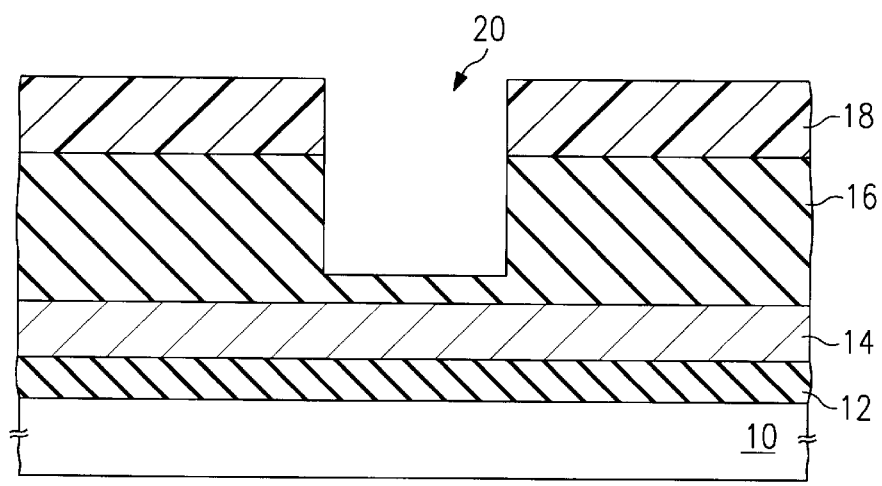

Referring to FIG. 2, insulating layer 16 is etched in opening 20 to form a contact opening partially through the insulating layer. The opening is preferably etched by an anisotropic etch such as reactive ion etching or other suitable means to take advantage of the ability to form substantially vertical sidewalls at the edges of opening 20 and to achieve better definition of small feature sizes on advance circuits. In accordance with state-of-the-art technology, the width of the contact opening may be on the order of 0.5 $\mu$m or smaller. In the first embodiment of the present invention, opening 20 is shown to continue partially through the insulating layer 16, preferably formed by a timed etch depending upon the thickness of the insulating layer.

Figure 3:
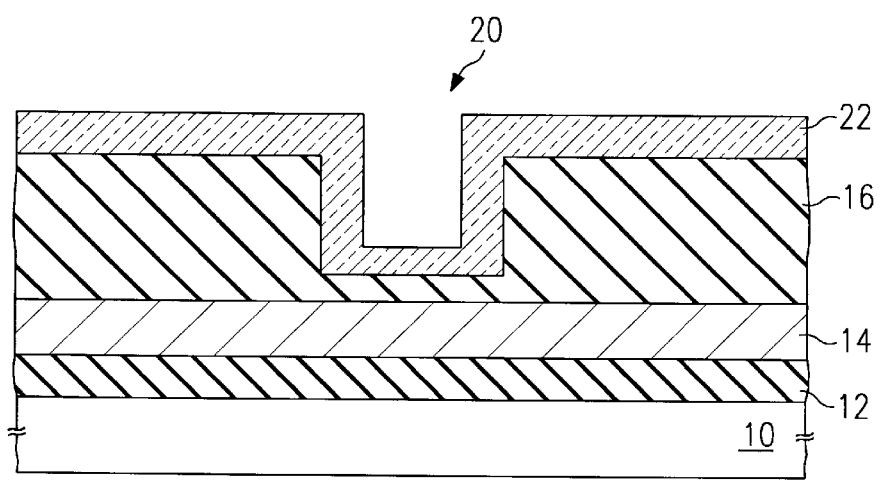

Referring to FIG. 3, photoresist layer 18 is removed, for example, by a wet chemical strip or a plasma strip. After contact opening 20 is formed partially through the insulating layer 16, a sidewall spacer film 22 is formed over insulating layer 16 and in opening 20. Sidewall spacer film 22 may be of any suitable material which may be selectively etched over the insulating layer 16, for example, polysilicon or nitride. This layer will be etched subsequently to leave sidewall spacers in contact opening 20, thus the thickness of this layer will depend upon the desired size of the resulting sidewall spacers, and is preferably on the order of 200 to 1000 angstroms.

Figure 4:
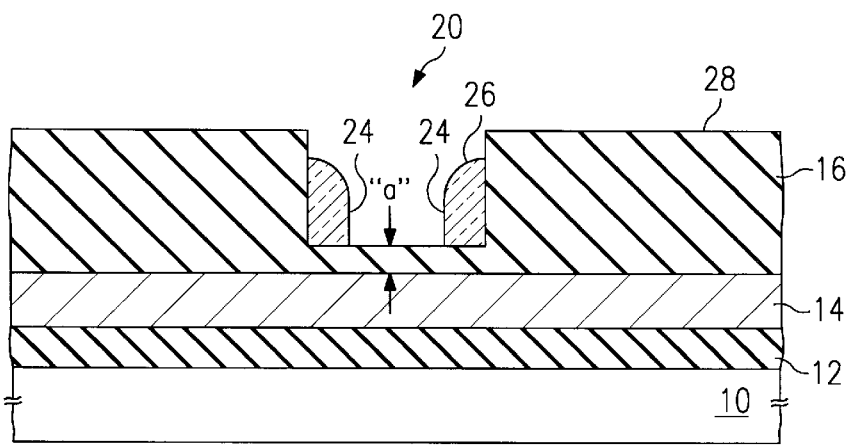

Referring to FIG. 4, an anisotropic etchback of the sidewall spacer film is performed leaving sidewall spacers 24. The sidewall spacer film may be overetched such that the upper region 26 of spacers 24 lie below the upper surface 28 of insulating layer 16 by a distance which is approximately equal to the thickness "a" of the remaining insulating layer 16 in the bottom of the contact opening 20 above the conducting layer 14. This etch may be a timed etch similar to the timed etch used to partially etch the insulating layer 16 in opening 20. This sidewall formation has advantages over standard sidewall formation. The insulating layer 16, up to this point, remains in the bottom of opening 20. If the underlying conducting layer 14, for example, is designed to have a minimum width, then there is a greater possibility of trenching around layer 14 into the underlying dielectric layer 12, particularly if the original contact opening 20, before the sidewall spacers are formed, lies outside the width of layer 14. In the present invention, the possibility of trenching diminishes since the opening to layer 14 is not made until the contact dimension of opening 20 is reduced.

Figure 5A:
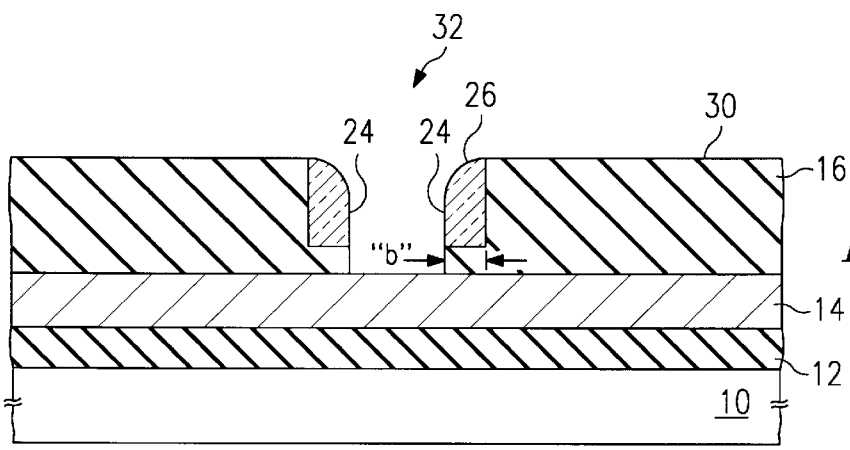

Referring to FIG. 5A, the insulating layer 16 in the bottom of opening 20 is etched to expose the underlying conducting layer 14. To avoid potential undercutting of the insulating layer 16 under the sidewall spacers during the etch step, it is preferable to use an anisotropic etch selective to the material of the insulating layer over the sidewall spacers 24. This etch will achieve substantially vertical sidewalls at the bottom of contact opening 32. Insulating layer 16 at the bottom of contact opening 32 will etch at essentially the same rate as the upper surface 28 (shown in FIG. 4). The thickness of the insulating layer removed at the upper surface 28 will be approximately the same as the amount removed in the bottom of the contact opening. Thus, before the removal of layer 16 in the bottom of the contact opening, the upper regions 26 of the sidewall spacers 24 lie below the upper surface 28 (FIG. 4) of insulating layer 16. However, after removal of layer 16 from the bottom of the contact opening and depending upon the etch rates of the spacers 24 and insulating layer 16, the upper surface 26 of the sidewall spacers 24 may be substantially planar with the upper surface 30 (FIG. 5A) of the insulating layer 16.

The contact dimension of the newly formed contact opening 32 with sidewall spacers 24 is now smaller than the original contact dimension of contact opening 20 prior to the formation of the sidewall spacers. The new contact dimension is smaller by twice the width "b" of each of the sidewall spacers 24. The contact dimension is now smaller than the lines which can be printed with photolithographic technology and materials. Thus, the process described above can reduce the minimum geometries which are readily achievable by modern photolithography equipment. The process of the present invention including the alternative embodiments can be continually scaled to achieve desired geometries and dimensions of the various features.

Figure 5B:
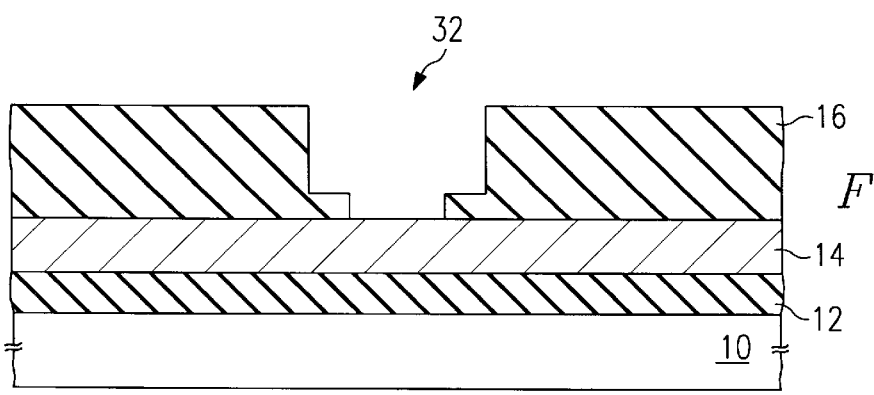

Referring to FIG. 5B, an alternative of the first embodiment is shown whereby the sidewall spacers 24 may be removed prior to subsequent processing steps such as metallization. Depending upon the depth of the sidewall spacer formed, this may have the advantage of providing a contact or via with a smaller contact dimension at the bottom of the opening to meet device requirements and packing densities without adding substantially to step coverage problems. Additionally, an overlying conductor may be formed with smaller dimensions due to the smaller effective opening at the top. The processes described above have the additional advantage of always staying one step ahead of the current photolithography technology.

Figure 6:
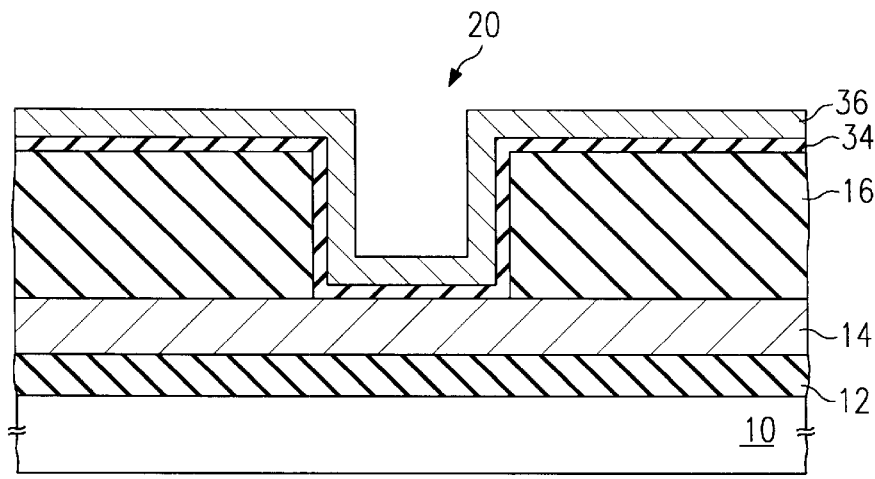
FIGS. 6–8 are cross-sectional views of the fabrication of a semiconductor integrated circuit according to a second alternative embodiment of the present invention.
Figure 7:
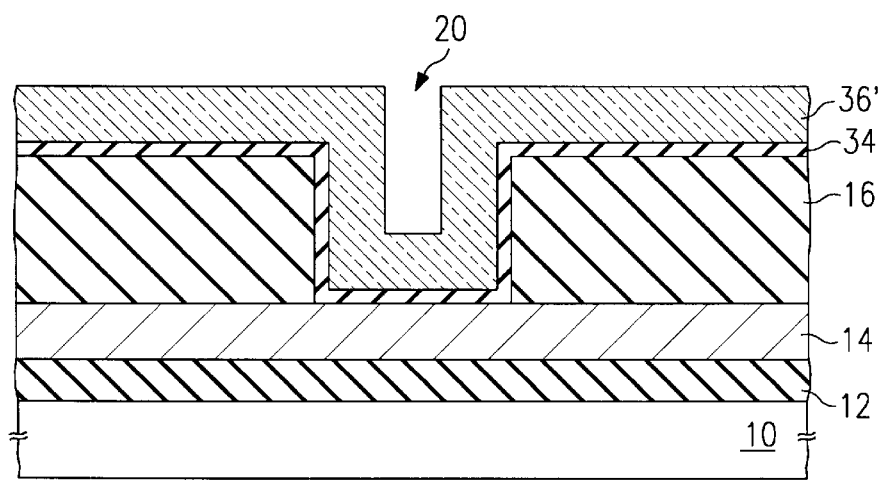
Figure 8:
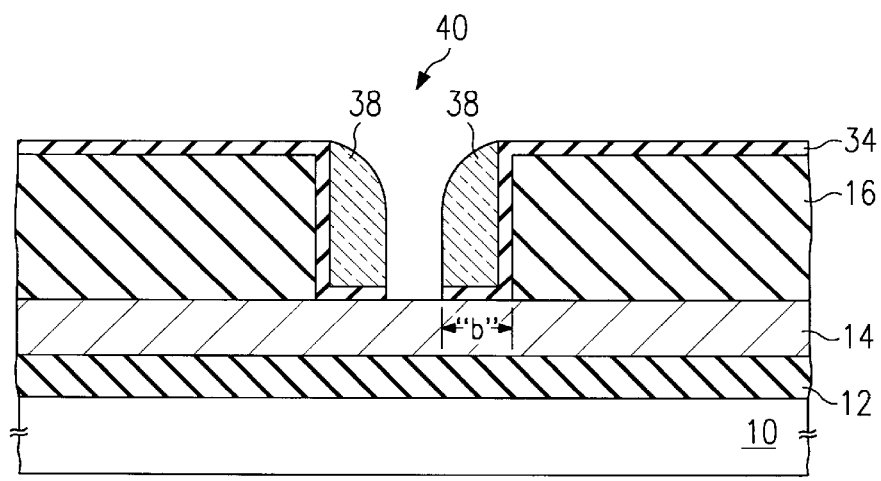

Referring now to FIGS. 6 through 8, a portion of an integrated circuit formed according to a second embodiment of the present invention will now be described. FIG. 6 illustrates, in cross-section, a partially formed integrated circuit structure at a surface of a wafer. For ease of understanding, the same reference numerals will be used for the same layers or regions of the integrated circuit as described above with reference to FIGS. 1 through 5. Insulating layer 12 is formed at a substrate surface 10. Conductive layer 14 lies over the insulating layer 12, and is the structure to which connection is to be made in the second alternative embodiment of the present invention. Insulating layer 16 is disposed over the conductive layer 14 and is illustrated after it has been etched to from opening 20. As noted hereinabove, while a contact to a conductive layer overlying an insulating layer such as a field oxide region is illustrated, the invention is equivalently applicable to contacts to a diffusion in the substrate, polysilicon electrodes, metal lines, and other structures in conventional integrated circuits.

Insulating layer 16 is etched to form a contact opening 20. As described above and in accordance with state-of-the-art technology, the width of the contact opening may be on the order of 0.5 $\mu$m or smaller. Insulating layer 16 may be any conventional insulator useful in modern integrated circuits, and is generally silicon dioxide, either as a single or as multiple layers. The thickness of insulating layer 16 through which the contact opening is formed may be on the order of 1.0 $\mu$m. In the second embodiment of the present invention, opening 20 is shown to continue through the insulating layer 16 exposing the conductive layer 14 in the bottom of the opening. The opening is preferably formed by an anisotropic etch to take advantage of the ability to form substantially vertical sidewalls.

After contact opening 20 is formed through the insulating layer 16, if desired, a thin layer of oxide 34, on the order of 100 to 300 angstroms may be deposited or grown to cover the exposed conducting layer 14 in the bottom of opening 20 to protect the conducting layer during subsequent processing steps. A thin layer of polysilicon 36 is deposited over insulating layer 16 and in opening 20.

Referring to FIG. 7, polysilicon layer 36 is oxidized to convert the polysilicon to an oxide 36' having a thickness on the order of approximately two (2) times the original thickness of polysilicon layer 36. Moisture and oxygen added to the system after the polysilicon is deposited causes the growth of silicon dioxide within the polysilicon structure converting the polysilicon into oxide and expanding the polysilicon accordingly, thereby decreasing the contact dimension within opening 20 by approximately four (4) times the thickness of standard deposited polysilicon. Thus, the thickness of the thin polysilicon layer 36 before oxidation is approximately one-half of the thickness of the oxidized polysilicon 36' and is more particularly determined based upon the desired final contact dimension and may be on the order of 100 to 500 angstroms. The resulting oxidized polysilicon thickness accordingly will be on the order of 200 to 1000 angstroms. The oxidation process may vary the resulting contact dimension and may reduce the contact dimension of the opening by as much as a 2:1 ratio depending on the polysilicon film thickness and the original contact size.

Referring to FIG. 8, the oxidized polysilicon layer 36' is anisotropically etched to form oxidized polysilicon sidewalls 38. If the thin oxide layer 34 was first formed, it will protect the surface of the underlying conductive layer 14 in opening 20 during the etch of the polysilicon layer 36' and then may be subsequently etched to expose layer 14. Polysilicon layer 36 may be doped with an appropriate dopant during or after deposition to provide a more uniform etch and oxidation rate particularly at lower oxidation temperatures.

The oxidized polysilicon is preferred over the formation of an oxide of the same final thickness since growth or deposition of a thick oxide tends to cause cusping at the corners. The oxidized polysilicon limits the cusping problems associated with deposited thicker oxides.

The width of the newly formed contact opening 40 now has a contact dimension smaller than the original contact dimension. The new contact dimension is smaller by twice the width "b" of each of the sidewall spacers 38. The contact dimension is now smaller than what is manufacturable with current state-of-the-art photolithography equipment.

Figure 9:
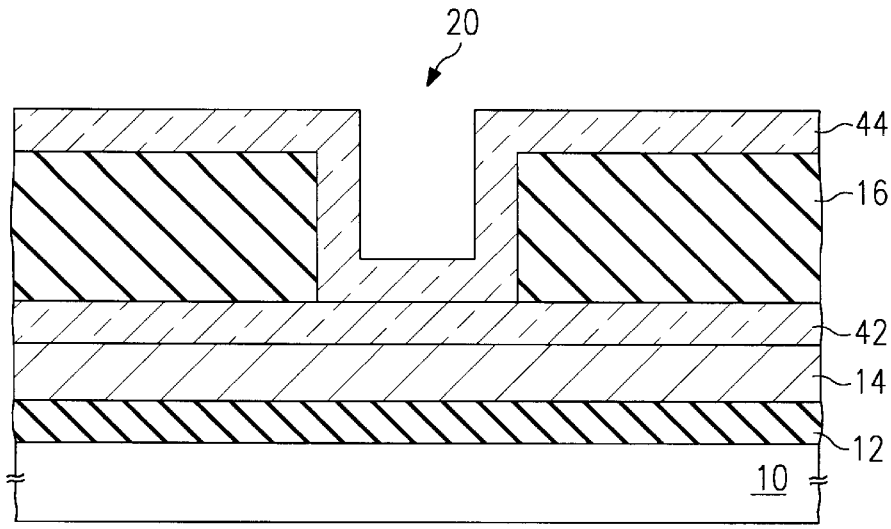
FIGS. 9–11 are cross-sectional views of the fabrication of a semiconductor integrated circuit according to a third alternative embodiment of the present invention.
Figure 10:
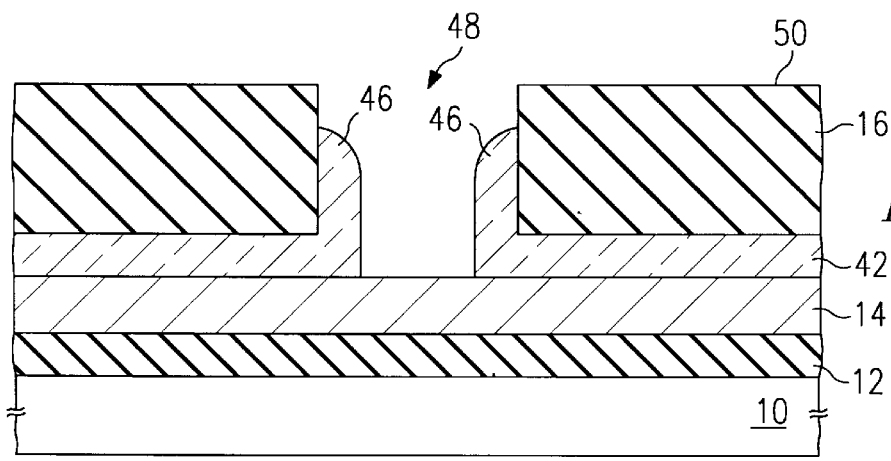
Figure 11:
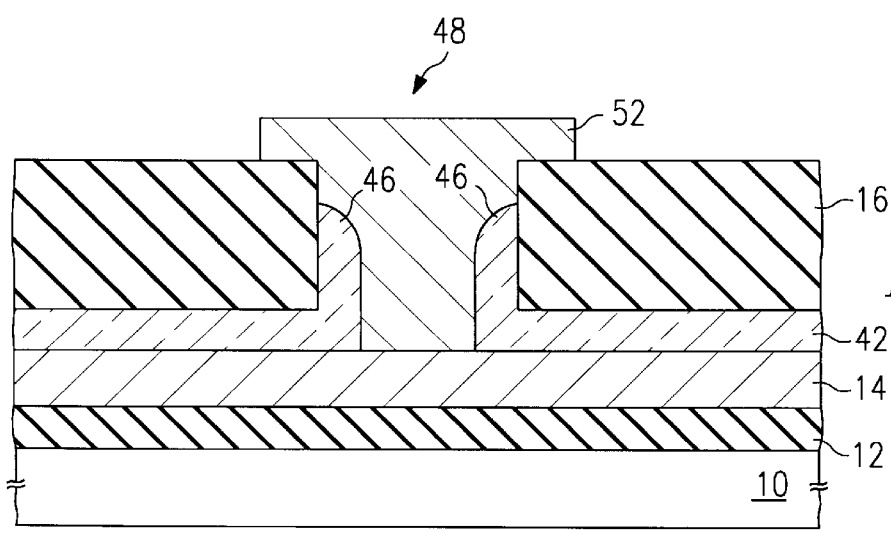

Referring to FIGS. 9 through 11, a portion of an integrated circuit formed according to a third embodiment of the present invention will now be described. FIG. 9 illustrates, in cross-section, a partially formed integrated circuit structure at a surface of a wafer. For ease of understanding, the same reference numerals will be used for the same layers or regions of the integrated circuit as described above with reference to FIGS. 1 through 8. Insulating layer 12 is formed at a substrate surface 10. Conductive layer 14 lies over the insulating layer 12, and is the structure to which connection is to be made in the third alternative embodiment of the present invention. In this embodiment, an etch stop layer 42 is shown disposed over the conductive layer 14. Etch stop layer 42 is deposited to a thickness on the order of 250 to 1000 angstroms and will protect the conductive layer during particular subsequent processing steps. The material for this layer should be chosen such that it may be selectively etched over the conductive layer 14. For example, a nitride or other suitable material may be selectively etched without substantially etching the underlying conductive layer 14. Insulating layer 16 is illustrated after it has been etched to form opening 20 and is disposed over the conductive layer 14. As noted hereinabove, while a contact to a conductive layer overlying an insulating layer such as a field oxide region is illustrated, this embodiment of the invention is also equivalently applicable to contacts to a diffusion in the substrate, polysilicon electrodes, metal lines, and other structures in conventional integrated circuits.

In this embodiment of the present invention, opening 20 is shown to continue through the insulating layer 16, preferably by a timed etch or end-point detection etch. The opening is preferably formed by an anisotropic etch to take advantage of the ability to form substantially vertical sidewalls along the sides of opening 20.

After contact opening 20 is formed through the insulating layer 16, a sidewall spacer film 44 is formed over insulating layer 16 and in opening 20. Sidewall spacer film 44 may be of any suitable material which may be selectively etched over the insulating layer 16 and having substantially the same etch rate as the etch stop layer 42. This layer will be etched to leave sidewall spacers in contact opening 20, thus the thickness of this layer will depend upon the desired contact dimension using the sidewall spacers to achieve this internal final contact or via dimension, and is preferably on the order of 200 to 1000 angstroms.

Referring to FIG. 10, the sidewall spacer film 44 is anisotropically etched to form sidewall spacers 46. This etch step will continue through the etch stop layer and expose the conductive layer 14 in opening 48. Since the sidewall spacer film is overetched by the thickness of the etch stop layer, the sidewall spacers will be etched by a similar amount and may be below the upper region 50 of insulating layer 16. The smallest contact dimension of the original opening 20 provided for by the current photolithography equipment has now been reduced to a smaller contact dimension determined by twice the width of each of the sidewall spacers 46 in the new opening 48. FIG. 11 illustrates a contact 52 made to the underlying conductive region 14 through opening. Those skilled in the art will appreciate that similar contacts may be formed in the alternate embodiments described above.

Figure 12:
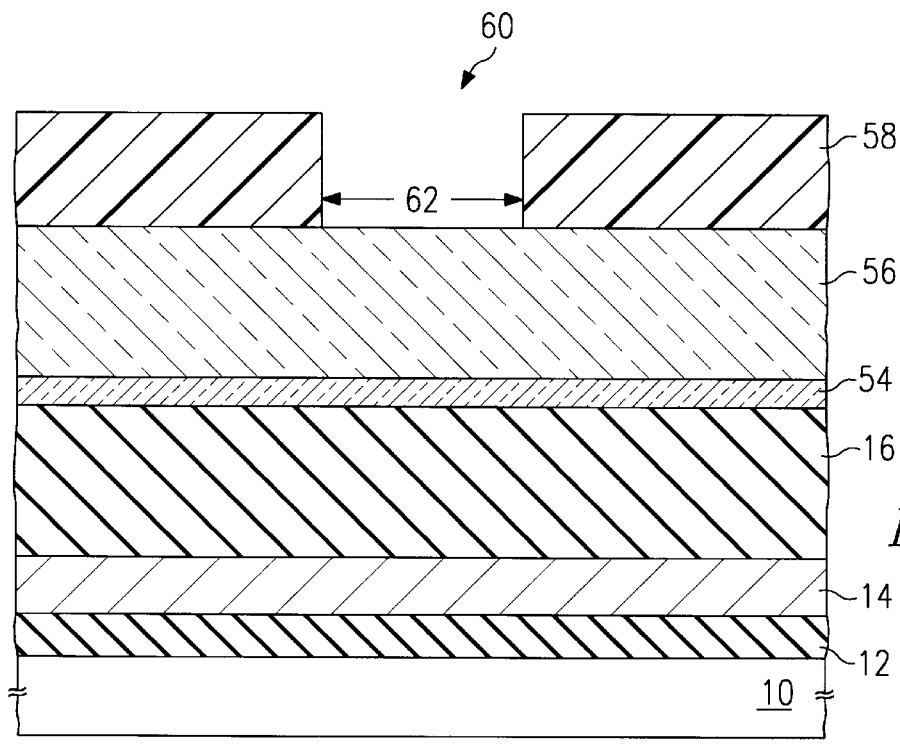
FIGS. 12–16 are cross-sectional views of the fabrication of a semiconductor integrated circuit according to a fourth alternate embodiment of the present invention.

Referring to FIGS. 12 through 16, a portion of an integrated circuit formed according to a fourth embodiment of the present invention will now be described. FIG. 12 illustrates, in cross-section, a partially formed integrated circuit structure at a surface of a wafer. For ease of understanding, the same reference numerals will be used for the same layers or regions of the integrated circuit as described above with reference to FIGS. 1 through 11. Insulating layer 12 is formed at a substrate surface 10. Conductive layer 14 lies over the insulating layer 12, and is the structure to which connection is to be made in the fourth alternative embodiment of the present invention. Insulating layer 16 is shown disposed over the conductive layer 14. As noted hereinabove, while a contact to a conductive layer overlying an insulating layer such as a field oxide region will be illustrated, this embodiment of the invention is also equivalently applicable to contacts to a diffusion in the substrate, polysilicon electrodes, metal lines, and other structures in conventional integrated circuits.

A thin etch stop layer 54 is formed over insulating layer 16. This etch stop layer is preferably nitride or polysilicon or any other suitable material which will have a different etch rate than insulating layer 16 for a given etchant. Layer 54 is preferably deposited by chemical vapor deposition to a thickness on the order of 100 to 1000 angstroms.

A sacrificial insulating layer 56 is formed over the etch stop layer 54. Layer 56 may be any suitable material such as an oxide which also has an etch rate different than the etch stop layer for a given etchant. Layer 54 is preferably a deposited oxide having a thickness on the order of 200 to 1000 angstroms. While layer 54 is shown here as planar, it is a conformal layer and will follow the contour of the underlying topography. If the oxide is deposited thick enough, it will tend to become more planar, particularly as it deposits over closely spaced devices and regions.

A photoresist layer 58 is formed over the sacrificial oxide layer 56 and is illustrated after it has been exposed and developed to define a small mask pattern for making the desired contact having a contact dimension 62. As described above, the resolution capability of the photoresist as well as the equipment used to correctly align and expose the photoresist will determine the particular size or contact dimension 62 of opening 60.

Figure 13:
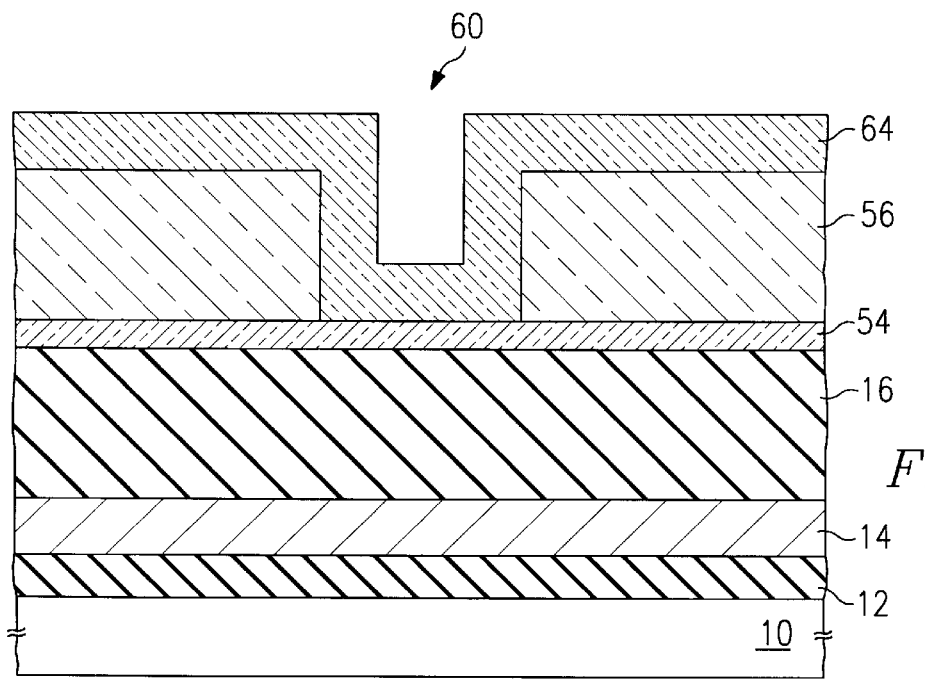

Referring to FIG. 13, the sacrificial oxide layer 56 is etched in opening 60 to expose a portion of the underlying etch stop layer 54. This etch step is preferably a endpoint detection etch which will stop when the etch stop layer is reached. As described above, it is preferable to anisotropically etch the oxide layer to take advantage of achieving substantially vertical sidewalls of the opening 60. The photoresist layer 58 is removed by methods known in the art, for example, by a wet chemical strip or a plasma strip. A sidewall spacer film 64 is formed over the sacrificial oxide layer 56 and in the opening 60 along the sidewalls of insulating layer 56 and the exposed etch stop layer 54 to a thickness on the order of 200 to 1000 angstroms. The sidewall spacer film 64 preferably has a similar etch ratio as the underlying etch stop layer 56 for a given etchant and may be a nitride or polysilicon or other suitable material. It is important that film 64 and etch stop layer 54 have an etch rate different than conductive layer 14 for reasons described below.

Figure 14:
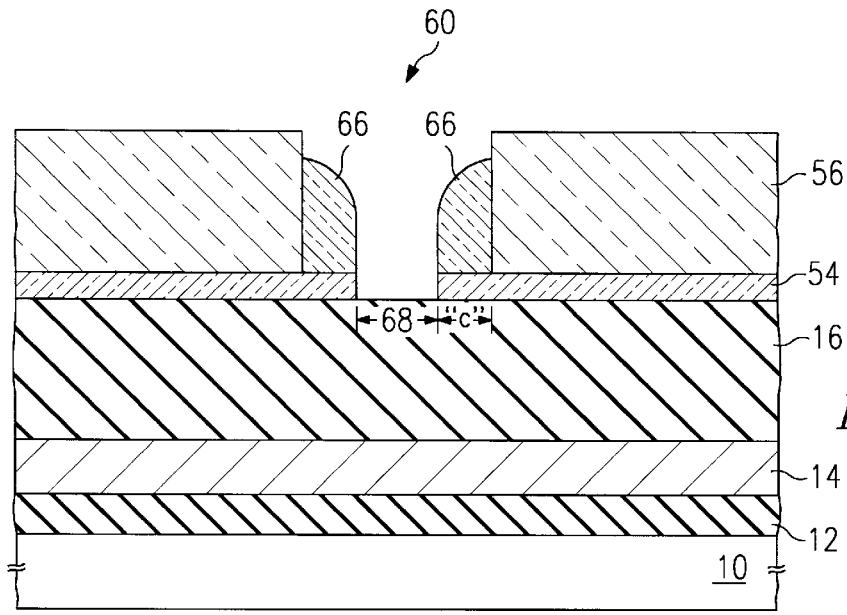

Referring to FIG. 14, the sidewall spacer film 64 and etch stop layer 54 are anisotropically etched to expose the underlying insulating layer 16 in opening 60. A sidewall spacer 66 is formed along the sidewalls of insulating layer 16. This etch step is preferably an endpoint detection etch which will stop when the insulating layer 16 is reached. Both the spacer film and etch stop layers must be etched in the bottom of the opening and because of the total thickness, an overetch of the spacer film is likely to result such that the upper surface of the spacers 66 is below the upper surface of insulating layer 56. The contact dimension 68 of opening 60 is now smaller than the original contact dimension 62 of opening 60 by the width "c" of each of the sidewall spacers 66. This contact dimension is smaller than the dimension which can be printed with modern photolithographic techniques and equipment.

Figure 15:
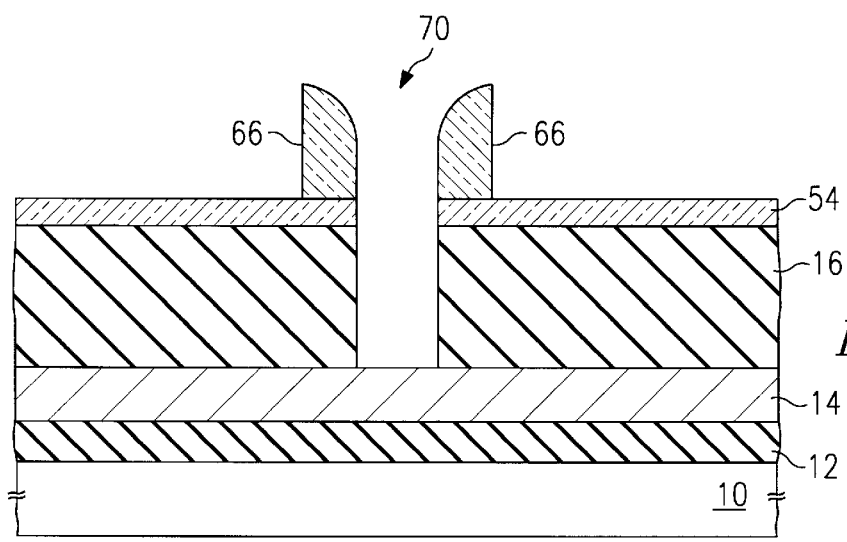

Referring to FIG. 15, an opening 70 is anisotropically etched in insulating layer 16 to expose the underlying conductive layer 14. This etch step will also remove the sacrificial oxide layer 56 if the etch rates for these two layers are similar for a given etchant. Any sacrificial oxide remaining is removed using the etch stop layer to prevent overetching the insulating layer 16.

Figure 16:
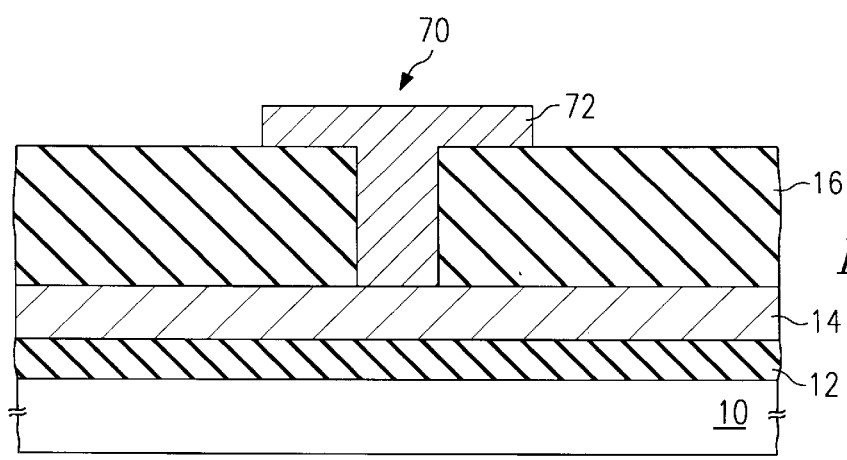

Referring to FIG. 16, the sidewall spacers 64 and etch stop layer 54 are preferably removed to provide a more planar surface before subsequent processing steps take place. In addition, removing the spacers and etch stop layer will lower the aspect ratio of opening 70 through insulating layer 16. In order to avoid etching any substantial portion of conductive layer 14 in opening 70, it is preferable that the etch rates for spacers 66 and etch stop layer 54 are different than conductive layer 14 for a given etchant. A contact 72 is illustrated making contact to the underlying conductive layer 14 and is formed by methods known in the art. As described above, the contact dimension of opening 70 is smaller than the contact dimension which can be printed with state-of-of-the-art lithographic processes and equipment.

If the present invention with the alternative embodiments described above is taken into account before the first contact opening is made, the packing density and geometries and dimensions of features underlying the contact or via opening may be similarly scaled. This process of reducing the minimum feature sizes can be continually scaled to achieve the desired geometries and dimensions not otherwise achievable with modern photolithography equipment and materials.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit, comprising:
   a conductive element;
   an insulating layer overlying the conductive element, having a contact opening therethrough to expose a portion of the conductive element;
   an etch stop layer disposed between the conductive element and the insulating layer and extending partially into the contact opening adjacent sidewalls of the contact opening; and
   sidewall spacers adjacent the sidewalls of the opening and overlying the etch stop layer extending into the opening, wherein the sidewall spacers have a width equal to a width of the portion of the etch stop layer extending into the opening.

2. The integrated circuit of claim 1, wherein the etch stop layer has substantially the same etch rate as the sidewall spacers for a given etchant, and wherein the etch rate is different than the etch rate of the conductive layer for a given etchant.

3. The integrated circuit of claim 1, wherein the etch rate of the sidewall spacers is substantially the same as the etch rate of the etch stop layer for a given etchant, and wherein the etch rate is different than the etch rate of the insulating layer for a given etchant.

4. The integrated circuit of claim 1, wherein the etch stop layer comprises nitride.

5. The integrated circuit of claim 1, wherein the sidewall spacers comprise nitride.

6. An integrated circuit comprising:
   a conductive element;
   an insulating layer overlying the conductive element, having a contact opening therethrough to expose a portion of the insulating layer and a portion of the conductive element;
   the opening having stepped sidewalls each having a substantially vertical top portion extending from an upper surface of the insulating layer and adjacent to a substantially vertical bottom portion extending to the exposed portion of the conductive element, wherein the bottom portion is narrower than the top portion;
   sidewall spacers adjacent to the top portions of the sidewalls of the opening and overlying the exposed portion of the insulating layer, wherein the sidewall spacers have a width equal to one half a difference between a width of the top portion and a width of the bottom portion.

7. The integrated circuit of claim 6, wherein the insulating layer has a thickness of approximately 0.5 $\mu$m.

8. The integrated circuit of claim 6, wherein the insulating layer comprises a single insulating layer.

9. The integrated circuit of claim 8, wherein the single layer comprises BPSG.

10. The integrated circuit of claim 8, wherein the single layer comprises oxide.

11. The integrated circuit of claim 6, wherein the insulating layer comprises multiple insulating layers.

12. The integrated circuit of claim 6, wherein the insulating layer comprises BPSG overlying oxide.

13. The integrated circuit of claim 6, wherein the conductive layer has a thickness of approximately 2000 to 7000 angstroms.

14. The integrated circuit of claim 6, wherein the conductive layer comprises a metal.

15. The integrated circuit of claim 6, wherein the conductive layer comprises polysilicon.

16. The integrated circuit of claim 6, wherein the conductive layer comprises a diffused region in a substrate.

17. The integrated circuit of claim 6, wherein the insulating layer comprises a thin conformal oxide layer overlying a thick insulating layer and a portion of the conductive layer.

18. The integrated circuit of claim 6, wherein each sidewall spacer has a thickness of approximately 200 to 1000 angstroms.

19. The integrated circuit of claim 6, wherein the sidewall spacers comprise an oxide.

20. The integrated circuit of claim 6, wherein the sidewall spacers comprise a nitride.

* * * * *

UNITED STATES PATENT AND TRADEMARK OFFICE
CERTIFICATE OF CORRECTION

PATENT NO.    : 5,847,460
DATED         : December 8, 1998
INVENTOR(S)   : Fu-Tai Lou, Mehdi Zamanian It is certified that error appears in the above-identified patent and that said Letters Patent is hereby corrected as shown below:

Delete claims 1-5.

Signed and Sealed this

Seventeenth Day of July, 2001

Attest:

Attesting Officer

NICHOLAS P. GODICI
Acting Director of the United States Patent and Trademark Office